United States Patent
Sako

(10) Patent No.: US 9,190,156 B2
(45) Date of Patent: *Nov. 17, 2015

(54) NAND FLASH MEMORY EMPLOYING BIT LINE CHARGE/DISCHARGE CIRCUIT

(71) Applicant: Kabushiki Kaisha Toshiba, Tokyo (JP)

(72) Inventor: Mario Sako, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 166 days.

This patent is subject to a terminal disclaimer.

(21) Appl. No.: 13/847,201

(22) Filed: Mar. 19, 2013

(65) Prior Publication Data

US 2013/0286748 A1    Oct. 31, 2013

(30) Foreign Application Priority Data

Apr. 27, 2012  (JP) ................ 2012-103947

(51) Int. Cl.

| G11C 16/24 | (2006.01) |
|---|---|
| G11C 16/26 | (2006.01) |
| H01L 27/115 | (2006.01) |
| G11C 16/04 | (2006.01) |
| G11C 29/02 | (2006.01) |
| G11C 29/12 | (2006.01) |

(52) U.S. Cl.
CPC .......... *G11C 16/24* (2013.01); *G11C 29/025* (2013.01); *H01L 27/11524* (2013.01); *G11C 16/0483* (2013.01); *G11C 29/02* (2013.01); *G11C 2029/1204* (2013.01)

(58) Field of Classification Search
USPC ...................... 365/185.21, 185.25
See application file for complete search history.

(56) References Cited

U.S. PATENT DOCUMENTS

| 6,480,419 B2 * | 11/2002 | Lee ................ 365/185.18 |
|---|---|---|
| 6,643,180 B2 | 11/2003 | Ikehashi et al. |
| 6,819,596 B2 | 11/2004 | Ikehashi et al. |
| 8,238,154 B2 | 8/2012 | Sako et al. |
| 8,315,094 B2 | 11/2012 | Kanda et al. |

(Continued)

FOREIGN PATENT DOCUMENTS

| JP | 8-46159 | 2/1996 |
|---|---|---|
| JP | 2002-117699 | 4/2002 |
| JP | 2010-198698 | 9/2010 |

(Continued)

OTHER PUBLICATIONS

Office Action in Japanese Patent Application No. 2012-103947 issued Jul. 14, 2015 with English translation.
Office Action in Japanese Patent Application No. 2012-103947, mailed Apr. 28, 2015 with English Translation.

*Primary Examiner* — Alexander Sofocleous
*Assistant Examiner* — Alfredo Bermudez Lozada
(74) *Attorney, Agent, or Firm* — Oblon, McClelland, Maier & Neustadt, L.L.P.

(57) ABSTRACT

According to one embodiment, a nonvolatile semiconductor storage device includes a memory cell array where memory cells are arranged in a row direction and a column direction in a matrix shape; word lines which select the memory cell in the row direction; bit lines which select the memory cells in the column direction; a sense amplifier circuit which determines values stored in the memory cells based on states of the bit line; and a charge/discharge circuit which is formed in a well where the memory cell array is arranged and which charges or discharges the bit lines.

20 Claims, 11 Drawing Sheets

(56) References Cited

U.S. PATENT DOCUMENTS

2008/0186766 A1* 8/2008 Ogura et al. ............. 365/185.05
2011/0235416 A1* 9/2011 Otsuka et al. ............ 365/185.11

FOREIGN PATENT DOCUMENTS

| | | |
|---|---|---|
| JP | 2011-119530 | 6/2011 |
| JP | 2011-198437 | 10/2011 |

* cited by examiner

Same Time

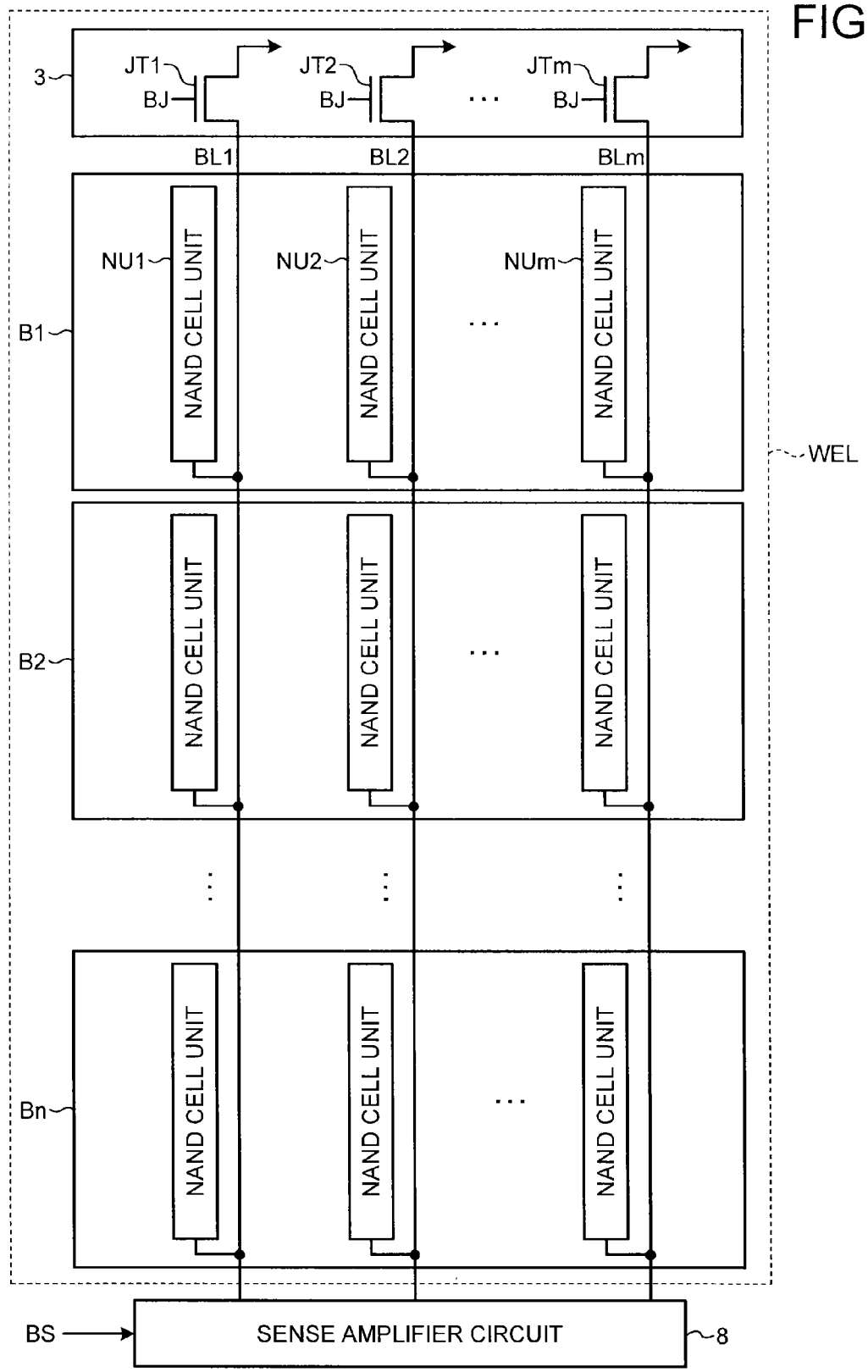

FIG.5A
FIG.5B
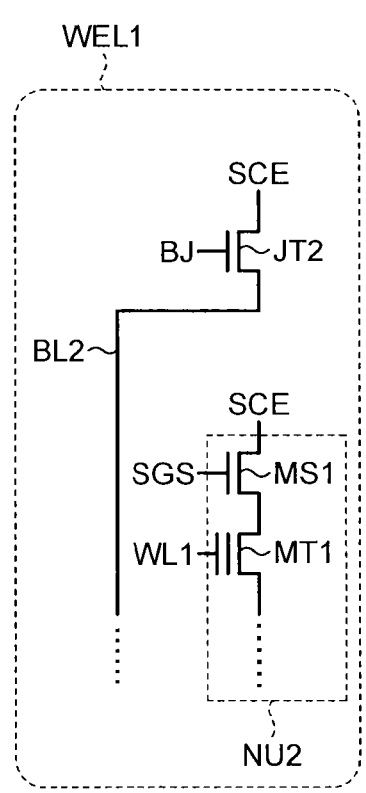
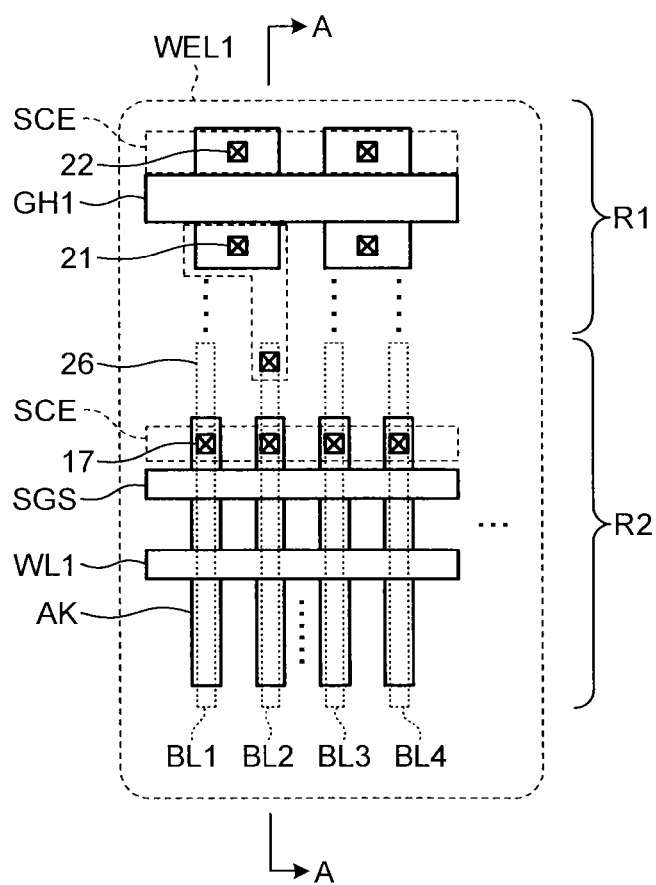

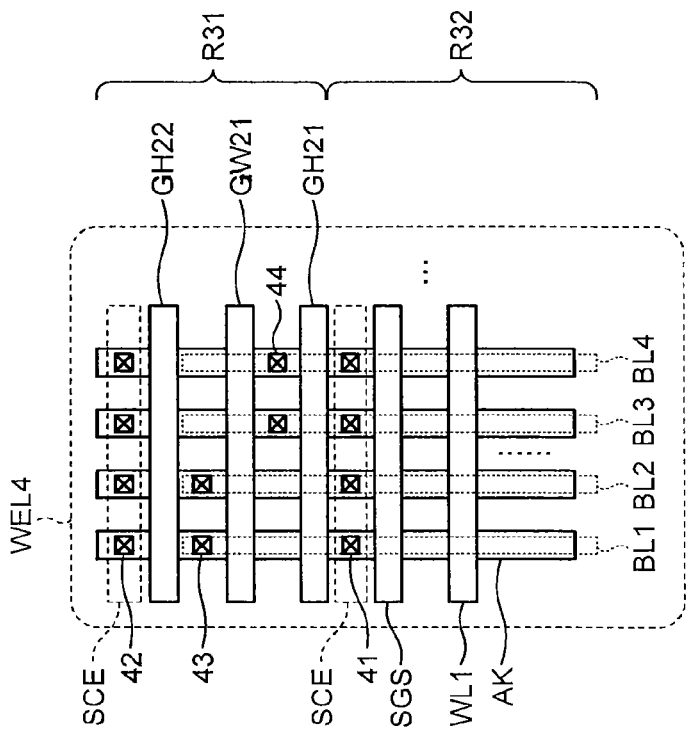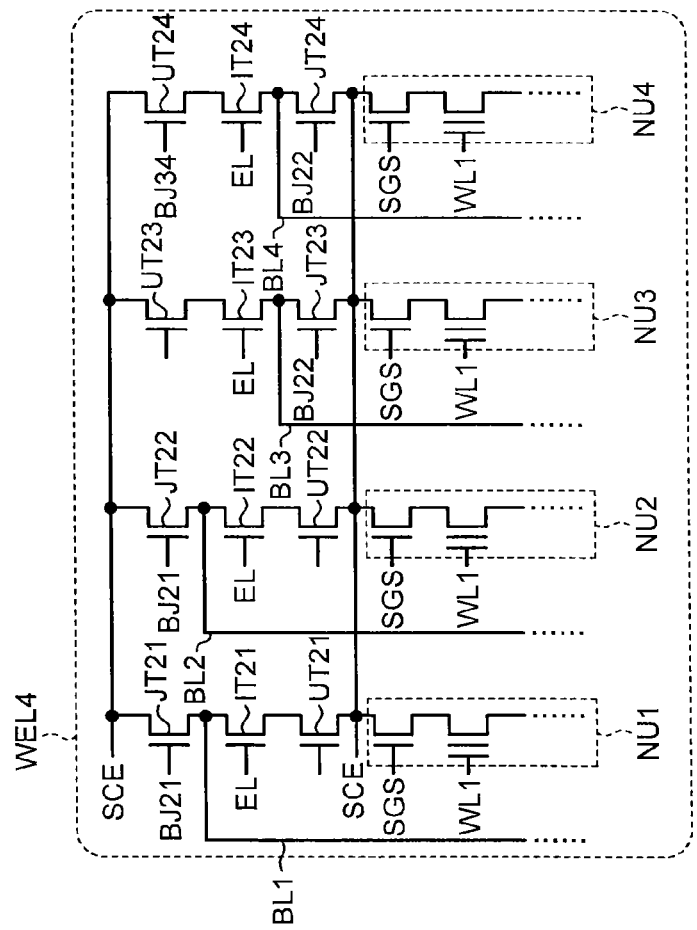

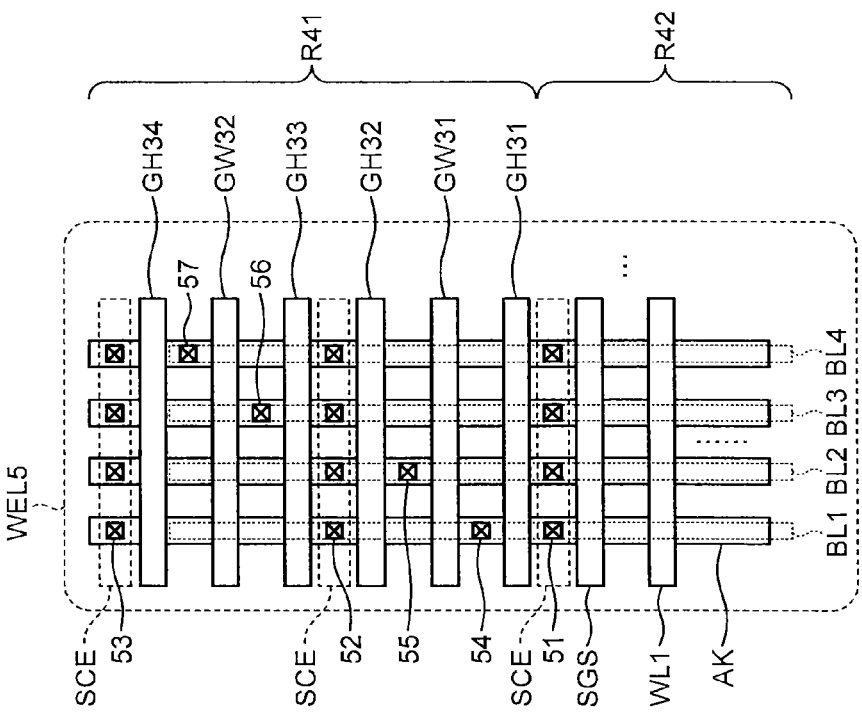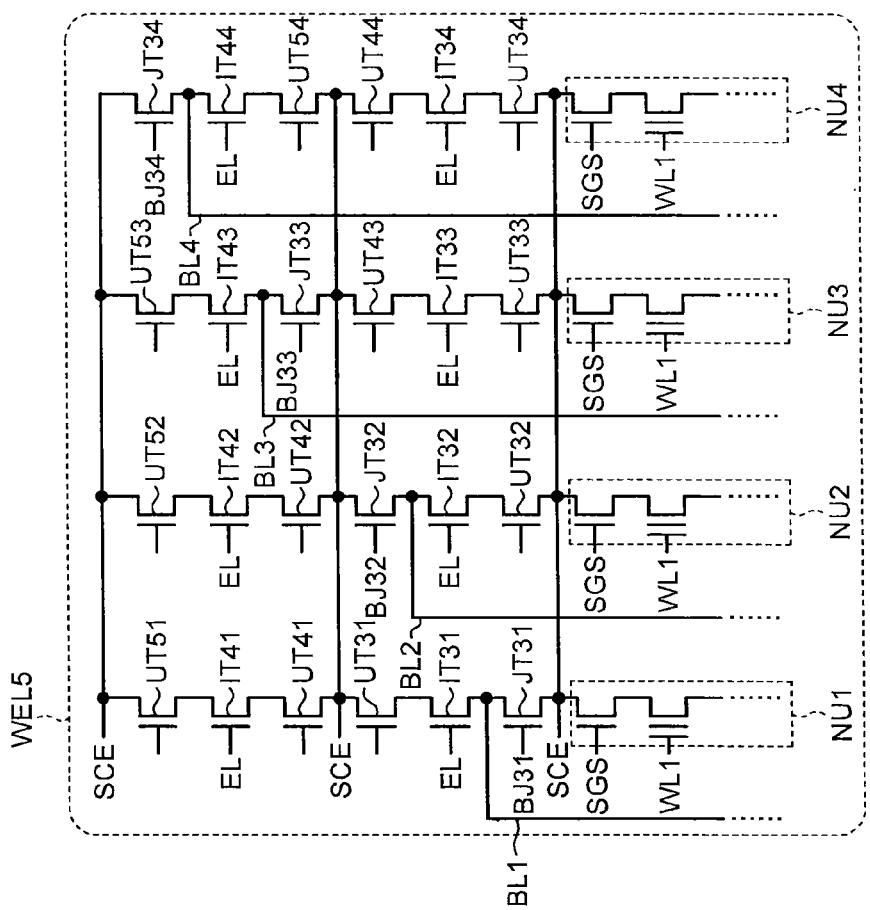

NAND FLASH MEMORY EMPLOYING BIT LINE CHARGE/DISCHARGE CIRCUIT

CROSS-REFERENCE TO RELATED APPLICATIONS

This application is based upon and claims the benefit of priority from Japanese Patent Application No. 2012-103947, filed on Apr. 27, 2012; the entire contents of which are incorporated herein by reference.

FIELD

Embodiments described herein relate generally to a nonvolatile semiconductor storage device.

BACKGROUND

In a NAND type flash memory, a discharge operation for bit lines is performed through a sense amplifier circuit when a read operation or the like is ended. When parasitic capacitance or sheet resistance of the bit lines is increased according to miniaturization of memory cells, a discharge time in the discharge operation is increased.

BRIEF DESCRIPTION OF THE DRAWINGS

FIG. 4 is a block diagram illustrating an example of a configuration of a charge/discharge circuit of FIG. 1;

FIG. 5A is a circuit diagram illustrating an example of a configuration of a charge/discharge circuit applied to a nonvolatile semiconductor storage device according to a second embodiment, and FIG. 5B is a plan diagram illustrating an example of a layout configuration of the charge/discharge circuit applied to the nonvolatile semiconductor storage device according to the second embodiment;

FIG. 10A is a circuit diagram illustrating an example of a configuration of a charge/discharge circuit applied to a nonvolatile semiconductor storage device according to a fifth embodiment, and FIG. 10B is a plan diagram illustrating an example of a layout configuration of the charge/discharge circuit applied to the nonvolatile semiconductor storage device according to the fifth embodiment;

FIG. 11A is a circuit diagram illustrating an example of a configuration of a charge/discharge circuit applied to a nonvolatile semiconductor storage device according to a sixth embodiment, and FIG. 11B is a plan diagram illustrating an example of a layout configuration of the charge/discharge circuit applied to the nonvolatile semiconductor storage device according to the sixth embodiment;

DETAILED DESCRIPTION

According to an embodiment, a nonvolatile semiconductor storage device is configured to include a memory cell array, word lines, bit lines, a sense amplifier circuit, and a charge/discharge circuit. In the memory cell array, memory cells are arranged in a row direction and a column direction in a matrix shape. The memory cells are selected in the row direction by the word lines. The memory cells are selected in the column direction by the bit lines. The sense amplifier circuit determines the value stored in the memory cell based on the state of the bit line. The charge/discharge circuit is formed in a well, where the memory cell array is arranged, to perform charging or discharging the bit line.

Hereinafter, the nonvolatile semiconductor storage device according to the embodiment will be described with reference to the drawings. In addition, the present invention is not limited to the embodiment.

First Embodiment

Figure 1:
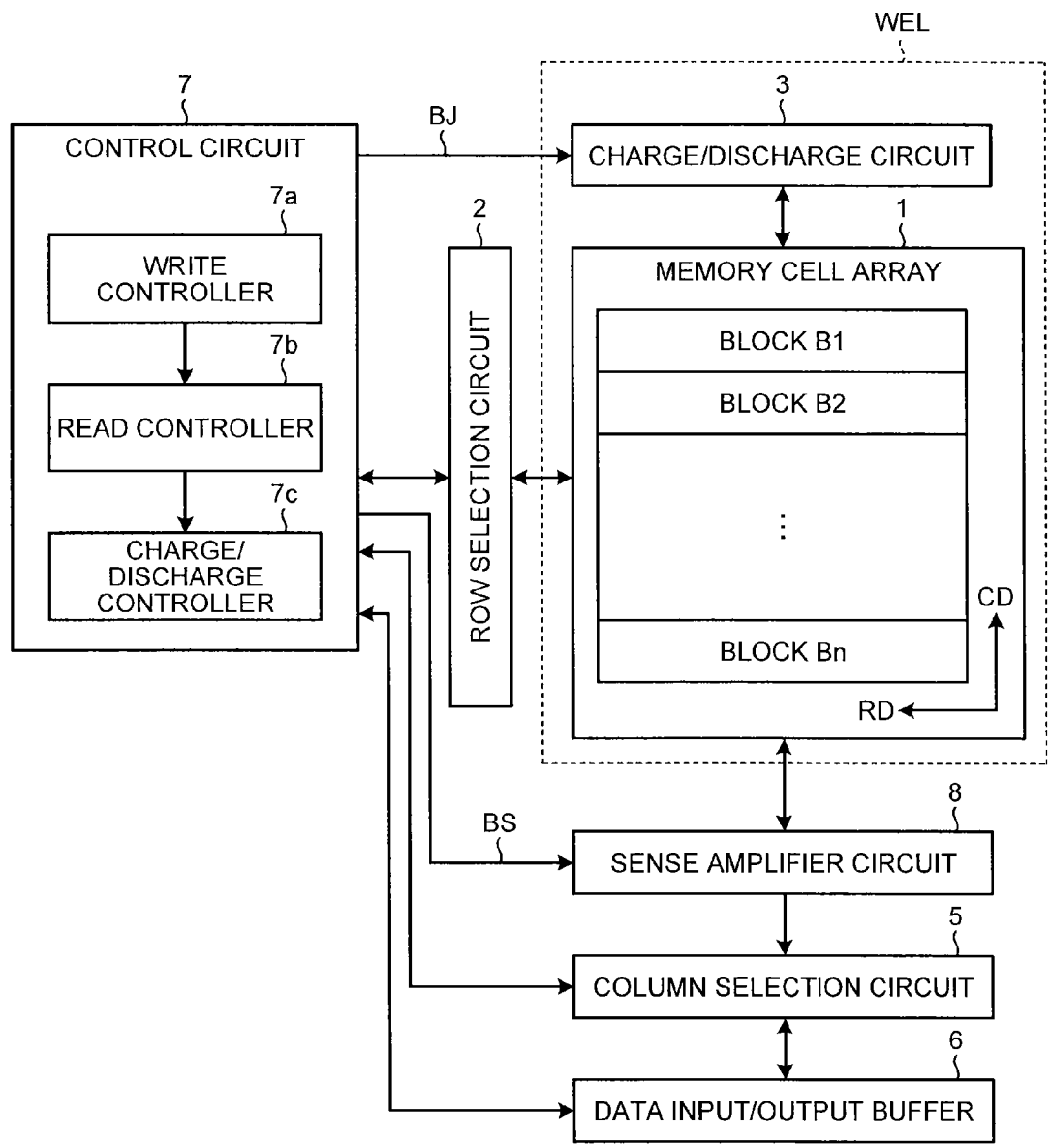
FIG. 1 is a block diagram illustrating a schematic configuration of a nonvolatile semiconductor storage device according to a first embodiment.

FIG. 1 is a block diagram illustrating a schematic configuration of a nonvolatile semiconductor storage device according to a first embodiment.

In FIG. 1, the nonvolatile semiconductor storage device is configured to include a memory cell array 1, a row selection circuit 2, a charge/discharge circuit 3, a column selection circuit 5, a data input/output buffer 6, a control circuit 7, and a sense amplifier circuit 8.

In the memory cell array 1, memory cells which store data are arranged in a row direction RD and a column direction CD in a matrix shape. In addition, one memory cell may be configured so as to store data for one bit, or one memory cell may be configured to have a multi-level so as to store data for two bits or more.

Herein, the memory cell array 1 is configured to include n (n is a positive integer) blocks B1 to Bn. In addition, each of the blocks B1 to Bn may be configured by arranging a plurality of NAND cell units in the row direction.

Figure 2:
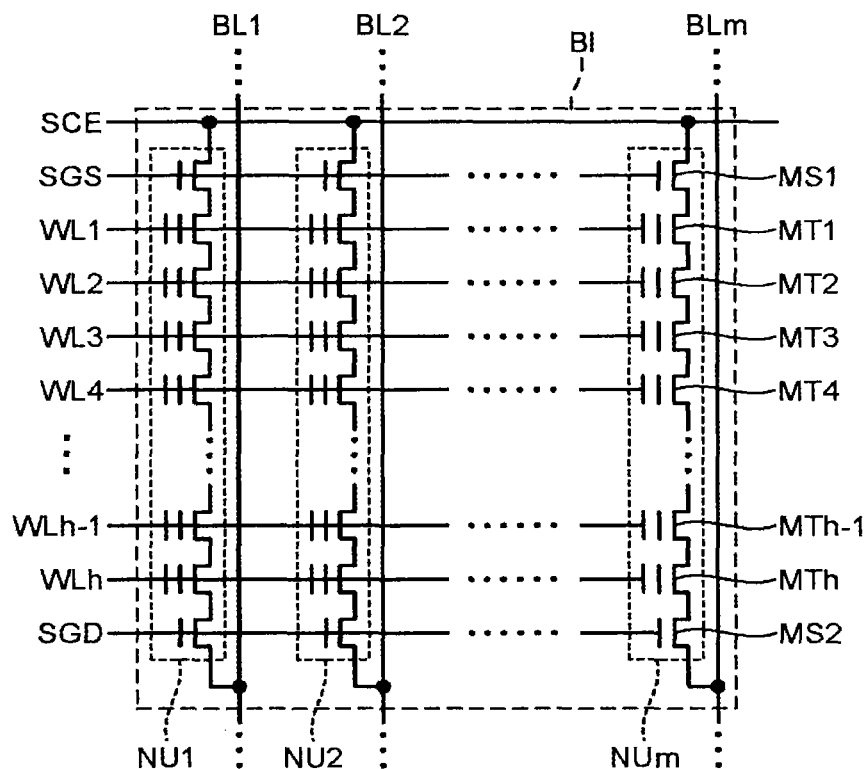
FIG. 2 is a circuit diagram illustrating a schematic configuration of blocks of the nonvolatile semiconductor storage device of FIG. 1.

FIG. 2 is a circuit diagram illustrating a schematic configuration of blocks of the nonvolatile semiconductor storage device of FIG. 1.

In FIG. 2, h (h is a positive integer) word lines WL1 to WLh, select gate lines SGD and SGS, and a source line SCE are installed in each of blocks B1 to Bn. In addition, m (m is a positive integer) bit lines BL1 to BLm are commonly installed in each of the blocks B1 to Bn.

In addition, m NAND cell units NU1 to NUm are installed in each of the blocks B1 to Bn, and the NAND cell units NU1 to NUm are connected to the bit lines BL1 to BLm, respectively.

Cell transistors MT1 to MTh and select transistors MS1 and MS2 are installed in each of the NAND cell units NU1 to NUm. In addition, one memory cell of the memory cell array 1 may be configured with one cell transistor. The cell transistors MT1 to MTh are connected in series so as to constitute a NAND string, and the select transistors MS1 and MS2 are connected to the two ends of the NAND string so as to constitute each of the NAND cell units NU1 to NUm.

In each of the NAND cell units NU1 to NUm, word lines WL1 to WLh are connected to control gate electrodes of the cell transistors MT1 to MTh. In addition, in each of the NAND cell units NU1 to NUm, the one end of the NAND string including the cell transistors MT1 to MTh is connected through the select transistor MS1 to each of the bit lines BL1 to BLm, and the other end of the NAND string is connected through the select transistor MS2 to the source line SCE.

In FIG. 1, the row selection circuit 2 can select the word line WL during read/write/erase operations for the memory cell. The charge/discharge circuit 3 can charge or discharge the bit lines BL1 to BLm during the read/write operations for the memory cell. The charge/discharge circuit 3 is formed in a well WEL arranged in the memory cell array 1. In addition, the charge/discharge circuit 3 can charge or discharge the bit lines BL1 to BLm in cooperation with the charge operation or the discharge operation for the bit lines BL1 to BLm by the sense amplifier circuit 8. The column selection circuit 5 can select the bit line BL during the read/write/erase operation for the memory cell. The sense amplifier circuit 8 can determine the data stored in the memory cell based on the states of the bit lines BL1 to BLm. The sense amplifier circuit 8 may be configured in a voltage sensing manner or in a current sensing manner. The data input/output buffer 6 transmits commands/addresses received from an external portion to the control circuit 7 or performs data communication between the sense amplifier circuit 8 and the external portion.

The control circuit 7 controls operations of the row selection circuit 2, the charge/discharge circuit 3, the column selection circuit 5, the data input/output buffer 6, and the sense amplifier circuit 8 based on commands and addresses. The control circuit 7 is configured to include a write controller 7a, a read controller 7b, and a charge/discharge controller 7c.

The write controller 7a can control the write operation for the memory cell. The read controller 7b can control the read operation for the memory cell. The charge/discharge controller 7c can control the charge operation and the discharge operation of the charge/discharge circuit 3 and the sense amplifier circuit 8. The write operation and the read operation are performed in unit of a plurality of memory cells (page) sharing a word line.

In the write operation, a program voltage (for example, 20 V) is applied to a selected word line of a selected block, and a central voltage (for example, 10 V) which is sufficient to turn on a cell transistor is applied to non-selected word lines. In addition, due to channel cut, a low voltage which is not to turn on a cell transistor may be applied to a portion of non-selected word lines. In addition, a write voltage (for example, 0 V) or a write prohibition voltage (for example, 2.5 V) is applied to a selected bit line according to to-be-written data.

In addition, a voltage (for example, 2.5 V) which turns on a selected cell in the case of intending to increase a threshold level of the selected cell and turns off the selected cell in the case of intending not to increase the threshold level of the selected cell is applied to the select gate line SGD. In addition, a low voltage which is sufficient to turn off the select transistor MS1 is applied to the select gate line SGS.

When the write voltage is applied to the selected bit line, a high voltage is applied to the control gate electrode of the selected cell, so that the write operation for the selected cell is performed.

On the other hand, when the write prohibition voltage is applied to the selected bit line, the select transistor MS2 is turned off. As a result, due to self boost, a potential of a channel of the selected cell connected to the selected word line is increased, so that the write prohibition operation for the selected cell is performed.

In the read operation, a read voltage (for example, 0 V) is applied to the selected word line of the selected block, and a central voltage (for example, 4.5 V) which is sufficient to turn on the non-selected word lines is applied to the non-selected word lines. In addition, a central voltage (for example, 4.5 V) which is sufficient to turn on the select transistor MS2 is applied to the select gate line SGD, and 0 V is applied to the select gate line SGS. In addition, a precharge voltage (for example, 1.5 V) is applied to the selected bit line, and a source voltage (for example, 1.2 V which is lower than the precharge voltage of a bit line) is applied to source line SCE.

Next, when the central voltage (for example, 4.5 V) which is sufficient to turn on the select transistor MS1 is applied to the select gate line SGS, in the case where threshold level of the selected cell does not reach to a read level, electric charges which are charged in the selected bit line are discharged through the NAND string, so that the potential of the selected bit line becomes a low level. On the other hand, in the case where the threshold level of the selected cell reaches the read level, since the electric charges which are charged in the selected bit line are not discharged through the NAND string, the potential of the selected bit line is maintained in a high level.

By determining whether the potential of the selected bit line is a low level or high level, it is determined whether or not the threshold level of the selected cell reaches the read level, and the data stored in the selected cell are read.

The read operation may be performed in a voltage sensing manner or in a current sensing manner. In the case of the current sensing, the precharge voltage is applied to the selected bit line, and the central voltage which is sufficient to turn on the select transistor MS1 is applied to the select gate SGS. Therefore, a current for the cell (cell current) is flowed through the bit line, and a current amount of the cell current is determined, so that the data stored in the cell are read.

In the erase operation, 0 V is applied to the word lines WL1 to WLh of the selected block, and a well potential of the selected block is set to an erase voltage (for example, 17 V). In addition, the source line SCE and select gate lines SGD and SGS of the selected block may be set to a floating state.

At this time, a high voltage is applied between the well WEL and the control gate electrode of the memory cell of the selected block. Therefore, the erase operation for the memory cell of the selected block is performed.

In order to reset the potentials of the bit lines BL1 to BLm after the write operation, the read operation, and the erase operation are ended, the discharge operation for the bit lines BL1 to BLm is performed. In addition, in the read operation, in order to reduce coupling noise between the bit lines BL1 to BLm, the discharge operation for the non-selected bit lines is performed. In addition, in the write operation, in order to set the non-selected bit lines to non-selected states, the charge operation for the non-selected bit lines is performed.

At this time, the charge/discharge circuit 3 can charge or discharge the bit lines BL1 to BLm in cooperation with the charge/discharge operation for the bit lines BL1 to BLm by the sense amplifier circuit 8. Accordingly, in comparison with the case where charging and discharging of the bit lines BL1 to BLm are performed only by the sense amplifier circuit 8, it is possible to shorten a charge/discharge time, so that it is possible to increase the speed of the charge/discharge operation. For example, the one end of each of the bit lines BL1 to BLm is connected to the sense amplifier circuit 8, and the other end of each of the bit lines BL1 to BLm is connected to the charge/discharge circuit 3, so that CR load of each of the bit lines BL1 to BLm can be reduced down to ¼. Herein, C is parasitic capacitance of each of the bit lines BL1 to BLm, and R is parasitic resistance of each of the bit lines BL1 to BLm.

In addition, since the charge/discharge circuit 3 is formed in the well WEL installed in the memory cell array 1, the charge/discharge circuit 3 can be configured in a low voltage resistant manner, in comparison with the case where the charge/discharge circuit 3 is formed in a region other than the well WEL, so that it is possible to reduce a layout area of the charge/discharge circuit 3.

Figure 3:
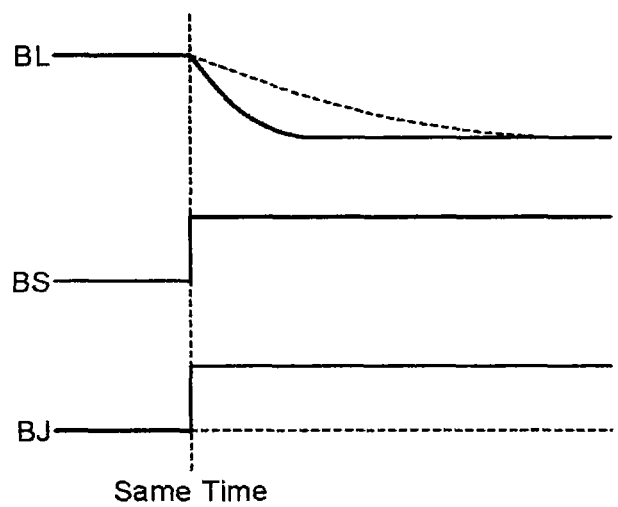
FIG. 3 is a timing chart illustrating an example of a discharge operation for a bit line of FIG. 2.

FIG. 3 is a timing chart illustrating an example of a discharge operation for a bit line of FIG. 2.

In FIG. 3, in the discharge operation for the bit line BL, a discharge instruction signal BJ instructing discharge start of the bit line BL is transmitted from the control circuit 7 to the charge/discharge circuit 3, and at the same time, a discharge instruction signal BS is transmitted from the control circuit 7 to the sense amplifier circuit 8. Therefore, the discharge operation for the bit line BL is performed through the charge/discharge circuit 3 and the sense amplifier circuit 8, so that the potential of the bit line BL is reset.

FIG. 4 is a block diagram illustrating an example of a configuration of the charge/discharge circuit of FIG. 1.

In FIG. 4, in the charge/discharge circuit 3, charge/discharge transistors JT1 to JTm are installed for each of the bit lines BL1 to BLm. For example, N-channel electric field effect transistors may be used as the charge/discharge transistors JT1 to JTm. The sources of the charge/discharge transistors JT1 to JTm are connected to the bit lines BL1 to BLm, and the drains of the charge/discharge transistors JT1 to JTm are connected to the source line SCE. The discharge instruction signal BJ is input to the gates of the charge/discharge transistors JT1 to JTm. When the discharge instruction signal BS is in a "H" level, the bit lines BL1 to BLm are discharged through the sense amplifier circuit 8, so that the potentials of the bit lines BL1 to BLm are smoothly decreased (dotted line). At this time, when the discharge instruction signal BJ is in the "H" level, and the charge/discharge transistors JT1 to JTm are turned on. The bit lines BL1 to BLm are discharged by the charge/discharge transistors JT1 to JTm, so that the potentials of the bit lines BL1 to BLm are rapidly decreased (solid line) in comparison with the case where the discharge instruction signal BJ is in the "L" level (dotted line).

Second Embodiment

Figure 6:
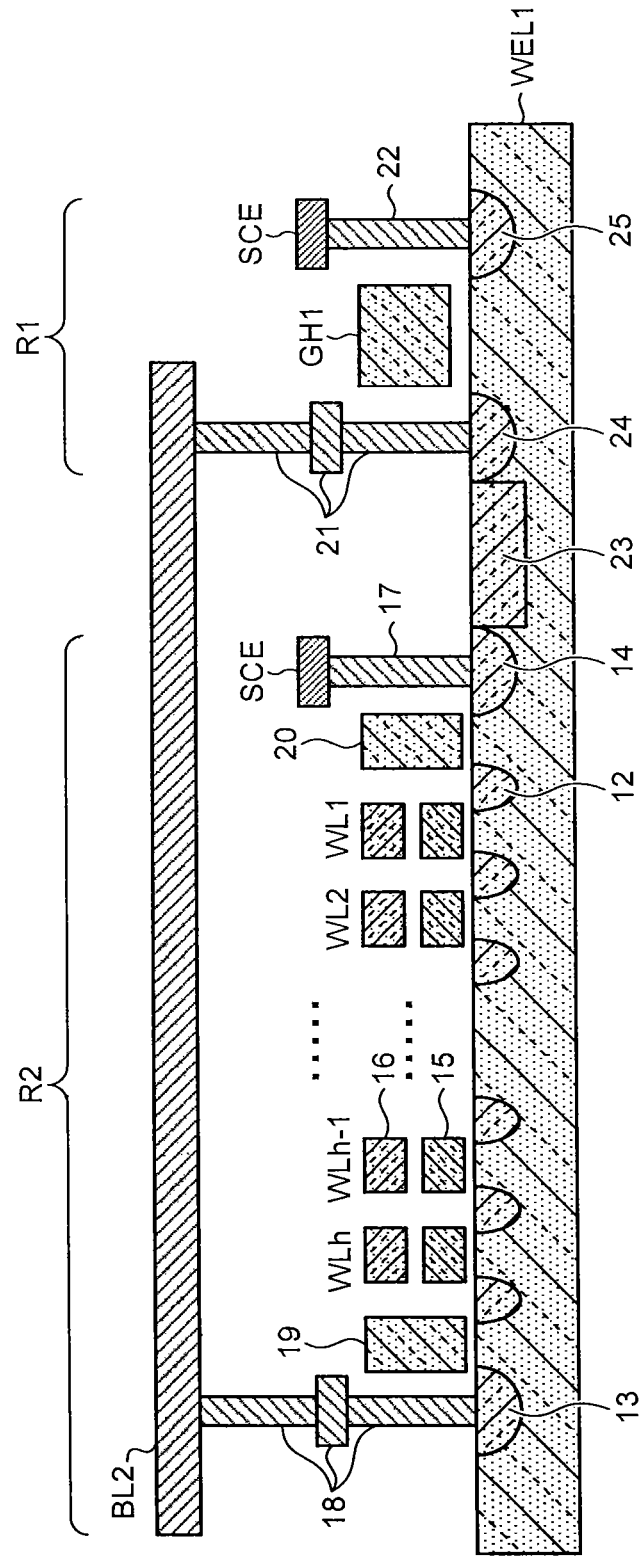
FIG. 6 is a cross-sectional diagram taken along line A-A of FIG. 5B.

FIG. 5A is a circuit diagram illustrating an example of a configuration of a charge/discharge circuit applied to a nonvolatile semiconductor storage device according to a second embodiment, and FIG. 5B is a plan diagram illustrating an example of a layout configuration of the charge/discharge circuit applied to the nonvolatile semiconductor storage device according to the second embodiment. FIG. 6 is a cross-sectional diagram taken along line A-A of FIG. 5B. FIG. 5B illustrates an example where four bit lines BL1 to BL4 are arranged. In addition, FIGS. 5A and 6 illustrate the bit line BL2 as an extracted portion.

In FIGS. 5A and 5B and FIG. 6, a memory cell array region R2 and a charge/discharge transistor region R1 are installed in a well WEL1. An element isolation layer 23 is formed in the well WEL1. The memory cell array region R2 and the charge/discharge transistor region R1 are isolated by the element isolation layer 23. For example, an STI (Shallow Trench Isolation) structure may be used for the element isolation layer 23.

In the memory cell array region R2, active regions AK which are isolated in the row direction are formed in the well WEL1, and each of the bit lines BL1 to BL4 is arranged on each of the active regions AK.

In each of the active regions AK, a charge storage layer 15 and select gate electrodes 19 and 20 are arranged on the well WEL1, and a control gate electrode 16 is arranged on the charge storage layer 15. In addition, the well WEL1 and the charge storage layer 15 can be insulated by a tunnel insulating film (not illustrated). The charge storage layer 15 and the control gate electrode 16 can be insulated by an inter-electrode insulating film (not illustrated). The one charge storage layer 15 and the control gate electrode 16 thereon may constitute one memory cell.

In the well WEL1, impurity diffusion layers 12, 13, and 14 are formed to be arranged between the charge storage layers 15 or between the charge storage layer 15 and the select gate electrodes 19 and 20.

The impurity diffusion layer 13 is connected through a contact electrode 18 to the bit line BL2, and the impurity diffusion layer 14 is connected through a contact electrode 17 to the source line SCE. In addition, the control gate electrode 16 of each of the memory cells is connected to each of the word lines WL1 to WL1, and the select gate electrodes 19 and 20 are connected to the select gate lines SGD and SGS, respectively.

On the other hand, a charge/discharge transistor JT2 is formed in the charge/discharge transistor region R1, and the charge/discharge transistor JT2 is connected to the bit line BL2. Here, a gate electrode GH1 is formed on the well WEL1. In addition, impurity diffusion layers 24 and 25 are formed in the well WEL1 so as to interpose a channel region under the gate electrode GH1. For example, the well WEL1 may be formed in a P type, and the impurity diffusion layers 12, 13, 14, 24, and 25 may be formed in an N type. The impurity diffusion layer 24 is connected through a contact electrode 21 to the bit line BL2, and the impurity diffusion layer 25 is connected through a contact electrode 22 to the source line SCE.

Here, since the charge/discharge transistor JT2 is formed in the well WEL1 installed in the memory cell array region R2, in comparison with the case where the charge/discharge transistor JT2 is formed in a region other than the well WEL1, the charge/discharge transistor JT2 can be configured in a low voltage resistant manner, and it is possible to reduce a layout area of the charge/discharge transistor JT2.

Third Embodiment

Figure 7A:
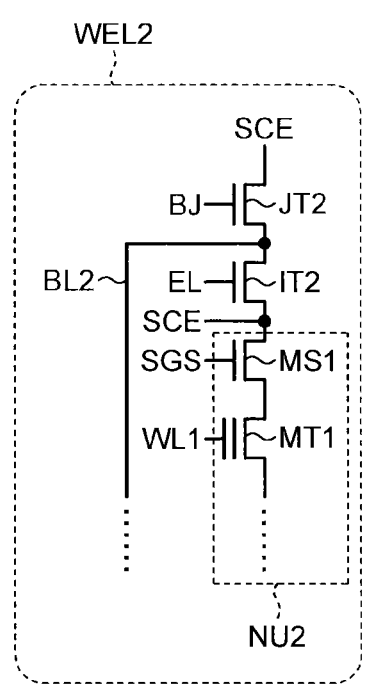
FIG. 7A is a circuit diagram illustrating an example of a configuration of a charge/discharge circuit applied to a nonvolatile semiconductor storage device according to a third embodiment.
Figure 7B:
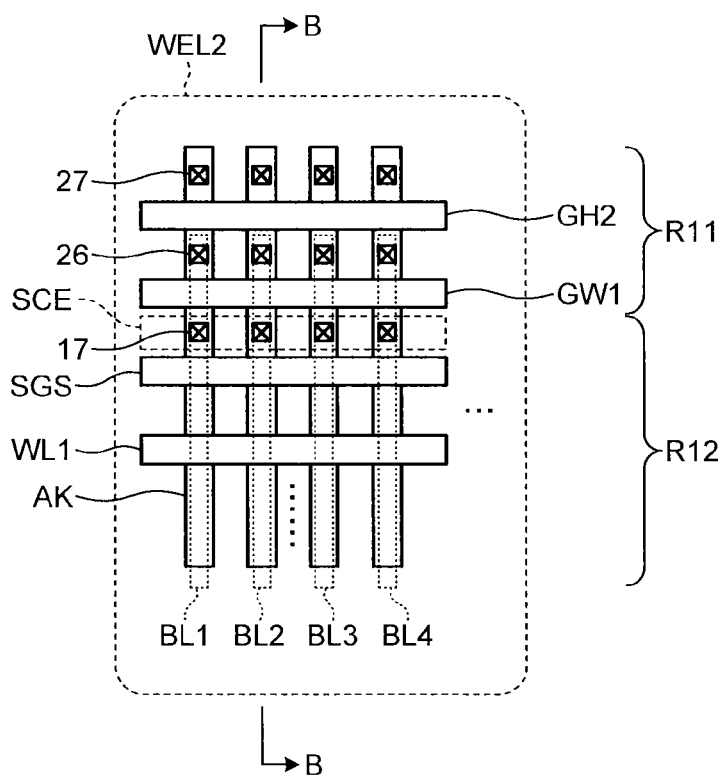
FIG. 7B is a plan diagram illustrating an example of a layout configuration of the charge/discharge circuit applied to the nonvolatile semiconductor storage device according to the third embodiment.
Figure 8:
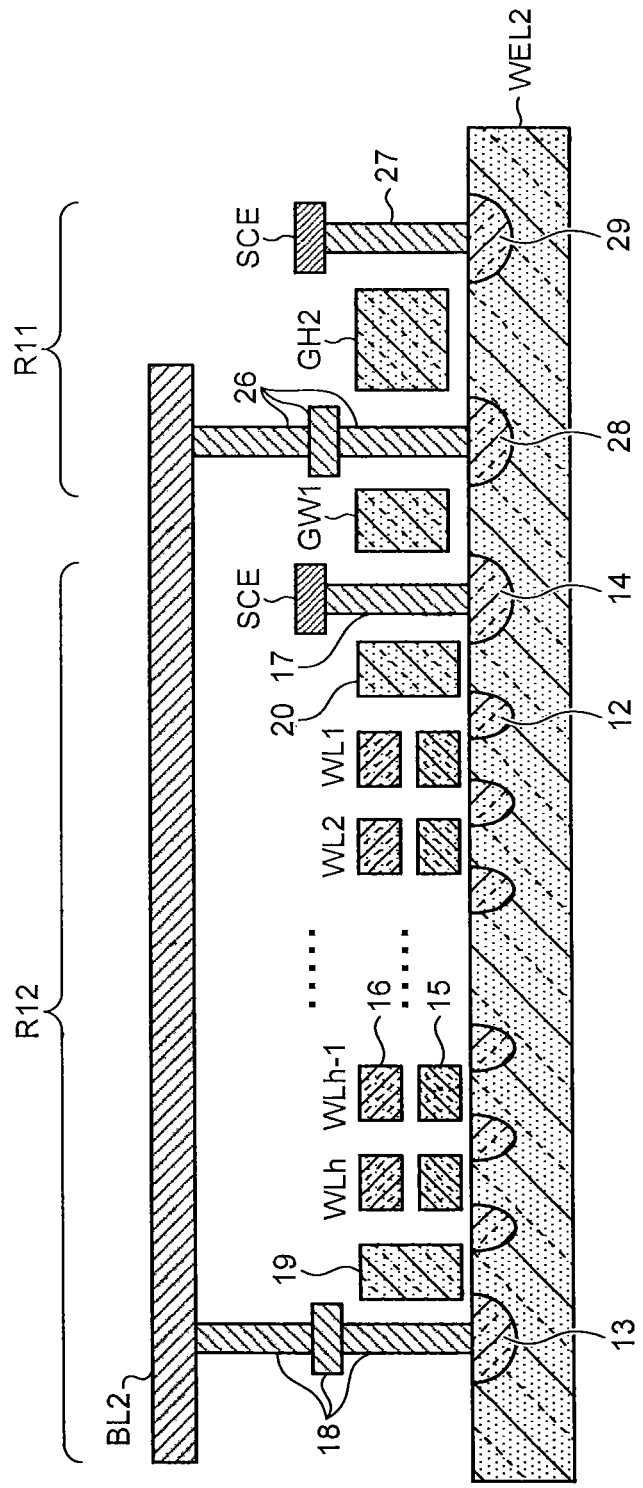
FIG. 8 is a cross-sectional diagram taken along line B-B of FIG. 7B.

FIG. 7A is a circuit diagram illustrating an example of a configuration of a charge/discharge circuit applied to a nonvolatile semiconductor storage device according to a third embodiment, and FIG. 7B is a plan diagram illustrating an example of a layout configuration of the charge/discharge circuit applied to the nonvolatile semiconductor storage device according to the third embodiment. FIG. 8 is a cross-sectional diagram taken along line B-B of FIG. 7B. FIG. 7B illustrates an example where four bit lines BL1 to BL4 are arranged. In addition, FIGS. 7A and 8 illustrate the bit line BL2 as an extracted portion.

In FIGS. 7A, 7B, and 8, a memory cell array region R12 and a charge/discharge transistor region R11 are installed in a well WEL2. In the memory cell array region R12, active regions AK which are isolated in the row direction are formed in the well WEL2, each of the bit lines BL1 to BL4 is arranged on each of the active regions AK.

In each of the active regions AK, a charge storage layer 15 and select gate electrodes 19 and 20 are arranged on the well WEL2, and a control gate electrode 16 is arranged on the charge storage layer 15. In addition, in the well WEL2, impurity diffusion layers 12, 13, and 14 are formed to be arranged between the charge storage layers 15 or between the charge storage layer 15 and the select gate electrodes 19 and 20.

The impurity diffusion layer 13 is connected through a contact electrode 18 to the bit line BL2, and the impurity diffusion layer 14 is connected through a contact electrode 17 to the source line SCE. In addition, the control gate electrode 16 of each of the memory cells is connected to each of the word lines WL1 to WL1, and the select gate electrodes 19 and 20 are connected to the select gate lines SGD and SGS, respectively.

On the other hand, in the charge/discharge transistor region R11, a charge/discharge transistor JT2 is formed in the active region AK, and the charge/discharge transistor JT2 is connected to the bit line BL2. In other words, NAND cell units NU and charge/discharge transistors are formed in the active regions AK which extend in the column direction CD. Here, a gate electrode GH2 of the charge/discharge transistor JT2 is formed on the active region AK. In addition, in the active region AK, impurity diffusion layers 28 and 29 are formed so as to interpose a channel region under the gate electrode GH2. For example, the well WEL2 may be formed in a P type, and the impurity diffusion layers 12, 13, 14, 28, and 29 may be formed in an N type. The impurity diffusion layer 28 is connected through a contact electrode 26 to the bit line BL2, and the impurity diffusion layer 29 is connected through a contact electrode 27 to the source line SCE.

In addition, an isolated transistor IT2 is formed in the active region AK between the memory cell array region R12 and the charge/discharge transistor region R11. Here, the source of the isolated transistor IT2 is connected to the source of the select transistor MS1, and the drain of the isolated transistor IT2 is connected to the drain of the charge/discharge transistor JT2. A well potential EL of the well WEL2 is applied to the gate of the isolated transistor IT2.

A gate electrode GW1 of the isolated transistor IT2 is formed in the active region AK. In addition, gate electrode GW1 may be arranged between the impurity diffusion layers 14 and 28. Therefore, when the well potential EL is applied to the gate electrode GW1 of the isolated transistor IT2, the isolated transistor IT2 is turned off, so that the memory cell array region R12 and the charge/discharge transistor region R11 are electrically isolated.

Since the charge/discharge transistor JT2 is formed in the active region AK where the memory cell is formed, it is possible to reduce a layout area of the charge/discharge transistor JT2. In addition, since the isolated transistor IT2 is formed in the active region AK, it is possible to electrically isolate the memory cell array region R12 and the charge/discharge transistor region R11 without cutting the active region AK.

In the example illustrated in FIGS. 7A, 7B, and 8, the configuration where the isolated transistor IT2 is formed in the active region AK in order to electrically isolate the memory cell array region R12 and the charge/discharge transistor region R11 is descried. However, the active region AK between the memory cell array region R12 and the charge/discharge transistor region R11 may be configured to be cut.

Fourth Embodiment

Figure 9A:
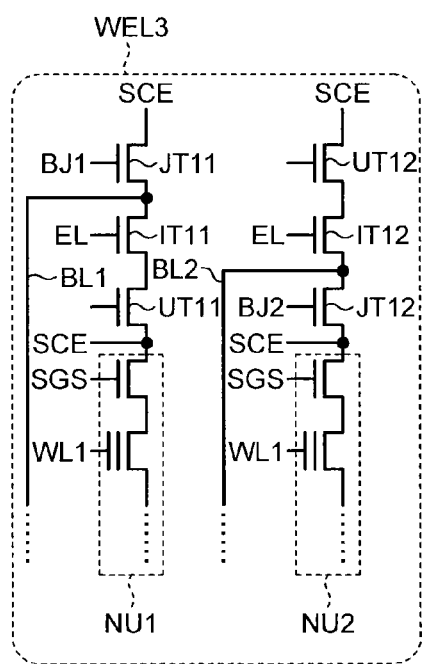
FIG. 9A is a circuit diagram illustrating an example of a configuration of a charge/discharge circuit applied to a nonvolatile semiconductor storage device according to a fourth embodiment.
Figure 9B:
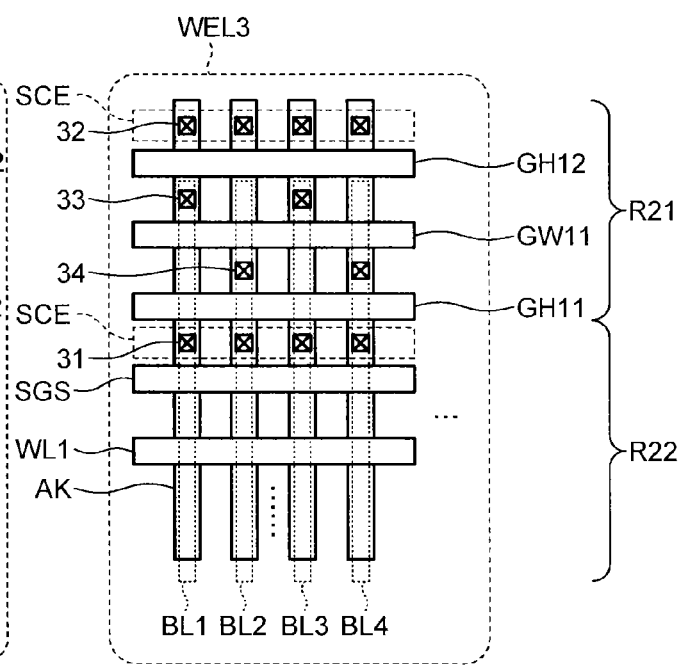
FIG. 9B is a plan diagram illustrating an example of a layout configuration of the charge/discharge circuit applied to the nonvolatile semiconductor storage device according to the fourth embodiment.

FIG. 9A is a circuit diagram illustrating an example of a configuration of a charge/discharge circuit applied to a nonvolatile semiconductor storage device according to a fourth embodiment, and FIG. 9B is a plan diagram illustrating an example of a layout configuration of the charge/discharge circuit applied to the nonvolatile semiconductor storage device according to the fourth embodiment. FIG. 9B illustrates an example where four bit lines BL1 to BL4 are arranged. In addition, FIG. 9A illustrates the bit lines BL1 and BL2 as an extracted portion.

In FIGS. 9A and 9B, a memory cell array region R22 and a charge/discharge transistor region R21 are installed in a well WEL3. In the memory cell array region R22, active regions AK which are isolated in the row direction are formed in the well WEL3; each of the bit lines BL1 to BL4 is formed on each of the active regions AK; and select gate lines SGS and SGD and word lines WL1 to WLh are formed so as to be perpendicular to the bit lines BL1 to BL4. The active region AK in the source side of the select gate line SGS is connected through a contact electrode 31 to the source line SCE.

On the other hand, in the charge/discharge transistor region R21, charge/discharge transistors JT11 and JT12, unused transistors UT11 and UT12, and isolated transistors IT11 and IT12 are formed in the active regions AK. The charge/discharge transistor JT11, the isolated transistor IT11, and the unused transistor UT11 are sequentially connected in series, and the source of the unused transistor UT11 is connected to the source side of the select gate line SGS. In addition, the unused transistor UT12, the isolated transistor IT12, and the charge/discharge transistor JT12 are sequentially connected in series, and the source of the charge/discharge transistor JT12 is connected to the source side of the select gate line SGS. The well potential EL of the well WEL3 is applied to the gates of the isolated transistors IT11 and IT12. The discharge instruction signals BJ1 and BJ2 are applied to the gates of the charge/discharge transistors JT11 and JT12, respectively.

Gate electrodes GH12 and GH11 of the charge/discharge transistors JT11 and JT12 and a gate electrode GW11 of the isolated transistors IT11 and IT12 are formed on the active region AK. The gate electrode GW11 is arranged between gate electrodes GH12 and GH11. The gate electrode GH12 is commonly used by the charge/discharge transistor JT11 and the unused transistor UT12. The gate electrode GH11 is commonly used by the charge/discharge transistor JT12 and the unused transistor UT11.

The odd-numbered bit lines BL1 and BL3 are connected through a contact electrode 33 to the active region AK between the gate electrodes GW11 and GH12, and the even-numbered bit lines BL2 and BL4 are connected through a contact electrode 34 to the active region AK between the gate electrodes GW11 and GH11. The active region AK in the drain side of the gate electrode GH12 is connected through a contact electrode 32 to the source line SCE.

When the well potential EL is applied to the gate electrode GW11 of the isolated transistors IT11 and IT12, the isolated transistors IT11 and IT12 are turned off. Therefore, the charge/discharge transistor JT11 and the unused transistor UT12 are electrically isolated from the unused transistor UT11 and the charge/discharge transistor JT12.

In the configuration illustrated in FIGS. 9A and 9B, selection and non-selection of the odd-numbered bit lines BL1 and BL3 and the even-numbered bit lines BL2 and BL4 can be alternately switched. For example, in the case where even-numbered bit lines BL2 and BL4 are selected, the potential of the discharge instruction signal BJ2 is set so as to allow the charge/discharge transistor JT12 to be cut off, so that the read operation can be normally performed through the even-numbered bit lines BL2 and BL4. At this time, the potential of the discharge instruction signal BJ1 is set so as to allow the charge/discharge transistor JT11 to be turned on, so that the charge/discharge operation for the non-selected odd-numbered bit lines BL1 and BL3 can be performed through the sense amplifier circuit 8 and the charge/discharge transistor JT11. Therefore, it is possible to increase the speed of the charge/discharge operation. For example, in the write operation, the charge operation for the non-selected odd-numbered bit lines BL1 and BL3 is performed through the sense amplifier circuit 8 and the charge/discharge transistor JT11, so that it is possible to increase the speed of the charge operation for the non-selected bit lines BL1 and BL3, and it is possible to shorten a non-selection time of the non-selected bit lines BL1 and BL3.

In addition, selection and non-selection are alternately switched between the odd-numbered bit lines BL1 and BL3 and the even-numbered bit lines BL2 and BL4, so that it is possible to use the non-selected bit line as noise shield, or it is possible to reduce inter-bit interference during the writing period for the memory cell.

Fifth Embodiment

FIG. 10A is a circuit diagram illustrating an example of a configuration of a charge/discharge circuit applied to a nonvolatile semiconductor storage device according to a fifth embodiment, and FIG. 10B is a plan diagram illustrating an example of a layout configuration of the charge/discharge circuit applied to the nonvolatile semiconductor storage device according to the fifth embodiment. FIGS. 10A and 10B illustrate an example where four bit lines BL1 to BL4 are arranged.

In FIGS. 10A and 10B, a memory cell array region R32 and a charge/discharge transistor region R31 are installed in a well WEL4. In the memory cell array region R32, active regions AK which are isolated in the row direction are formed in the well WEL4; each of the bit lines BL1 to BL4 is arranged on each of the active regions AK; and select gate lines SGS and SGD and word lines WL1 to WLh are formed so as to be perpendicular to the bit lines BL1 to BL4. The active region AK in the source side of the select gate line SGS is connected through a contact electrode 41 to the source line SCE.

On the other hand, in the charge/discharge transistor region R31, charge/discharge transistors JT21 to JT24, unused transistors UT21 to UT24, and isolated transistors IT21 to IT24 are formed in the active regions AK. The charge/discharge transistor JT21, the isolated transistor IT21, and the unused transistor UT21 are sequentially connected in series, and the source of the unused transistor UT21 is connected to the source side of the select gate line SGS. In addition, the charge/discharge transistor JT22, the isolated transistor IT22, and the unused transistor UT22 are sequentially connected in series, and the source of the unused transistor UT22 is connected to the source side of the select gate line SGS. In addition, the unused transistor UT23, the isolated transistor IT23, and the charge/discharge transistor JT23 are sequentially connected in series, and the source of the charge/discharge transistor JT23 is connected to the source side of the select gate line SGS. In addition, the unused transistor UT24, the isolated transistor IT24, and the charge/discharge transistor JT24 are sequentially connected in series, and the source of the charge/discharge transistor JT24 is connected to the source side of the select gate line SGS. The well potential EL of the well WEL4 is applied to the gates of the isolated transistors IT21 to IT24. A discharge instruction signal BJ21 is applied to the gates of the charge/discharge transistors JT21 and JT22, and a discharge instruction signal BJ22 is applied to the gates of the charge/discharge transistors JT23 and JT24.

A gate electrode GH21 of the charge/discharge transistors JT23 and JT24, a gate electrode GH22 of the charge/discharge transistors JT21 and JT22, and a gate electrode GW21 of the isolated transistors IT21 to IT24 are formed in the active regions AK. The gate electrode GW21 is arranged between the gate electrodes GH22 and GH21. The gate electrode GH22 is commonly used by the charge/discharge transistors JT21 and JT22 and the unused transistors UT23 and UT24. The gate electrode GH21 is commonly used by the charge/discharge transistors JT23 and JT24 and the unused transistors UT21 and UT22.

The bit line BL1 is connected through a contact electrode 43 to the active region AK between the gate electrodes GW21 and GH22; the bit line BL2 is connected through a contact electrode 44 to the active region AK between the gate electrodes GW21 and GH22; the bit line BL3 is connected through a contact electrode 45 to the active region AK between the gate electrodes GW21 and GH21; and the bit line BL4 is connected through a contact electrode 46 to the active region AK between the gate electrodes GW21 and GH21. The active region AK in the drain side of the gate electrode GH22 is connected through a contact electrode 42 to the source line SCE.

When the well potential EL is applied to the gate electrode GW21 of the isolated transistors IT21 to IT24, the isolated transistors IT21 to IT24 are turned off. Therefore, the charge/discharge transistors JT21 and JT22 and the unused transistors UT23 and UT24 are electrically isolated from the unused transistors UT21 and UT22 and the charge/discharge transistors JT23 and JT24.

In the configuration illustrated in FIGS. 10A and 10B, selection and non-selection of the two adjacent bit lines BL1 and BL2 and the two adjacent bit lines BL3 and BL4 can be alternately switched. For example, in the case where the two adjacent bit lines BL3 and BL4 are selected, the potential of the discharge instruction signal BJ21 is set so as to allow the charge/discharge transistors JT23 and JT24 to be cut off, so that the write operation can be normally performed through the two adjacent bit lines BL3 and BL4. At this time, the potential of the discharge instruction signal BJ21 is set so as to allow the charge/discharge transistors JT21 and JT22 to be turned on, so that the charge/discharge operation for the non-selected bit lines BL1 and BL2 can be performed through the sense amplifier circuit 8 and the charge/discharge transistors JT21 and JT22. Therefore, it is possible to increase the speed of the charge/discharge operation. For example, in the write operation, the charge operation for the non-selected bit lines BL1 and BL2 is performed through the sense amplifier circuit 8 and the charge/discharge transistors JT21 and JT22, so that it is possible to increase the speed of the charge operation for the non-selected bit lines BL1 and BL2, and it is possible to shorten a non-selection time of the non-selected bit lines BL1 and BL2.

In addition, selection and non-selection are alternately switched between the two adjacent bit lines BL1 and BL2 and the two adjacent bit lines BL3 and BL4, so that it is possible to reduce inter-bit interference during the writing period for the memory cell.

Sixth Embodiment

FIG. 11A is a circuit diagram illustrating an example of a configuration of a charge/discharge circuit applied to a nonvolatile semiconductor storage device according to a sixth embodiment, and FIG. 11B is a plan diagram illustrating an example of a layout configuration of the charge/discharge circuit applied to the nonvolatile semiconductor storage device according to the sixth embodiment. FIGS. 11A and 11B illustrate an example where four bit lines BL1 to BL4 are arranged.

In FIGS. 11A and 11B, a memory cell array region R42 and a charge/discharge transistor region R41 are installed in a well WEL5. In the memory cell array region R42, active regions AK which are isolated in the row direction are formed in the well WEL5; each of the bit lines BL1 to BL4 is arranged on each of the active regions AK; and select gate lines SGS and SGD and word lines WL1 to WLh are formed so as to be perpendicular to the bit lines BL1 to BL4. The active region AK in the source side of the select gate line SGS is connected through a contact electrode 51 to the source line SCE.

On the other hand, in the charge/discharge transistor region R41, charge/discharge transistors JT31 to JT34, unused transistors UT31 to UT34, UT41 to UT44, and UT51 to UT54, and isolated transistors IT31 to IT34 and IT41 to IT44 are formed in the active regions AK. The unused transistor UT51, the isolated transistor IT41, the unused transistor UT41, the unused transistor UT31, the isolated transistor IT31, and the charge/discharge transistor JT31 are sequentially connected in series, and the source of the charge/discharge transistor JT31 is connected to the source side of the select gate line SGS. In addition, the unused transistor UT52, the isolated transistor IT42, the unused transistor UT42, the charge/discharge transistor JT32, the isolated transistor IT32, and the unused transistor UT32 are sequentially connected in series, and the source of the unused transistor UT32 is connected to the source side of the select gate line SGS. In addition, the unused transistor UT53, the isolated transistor IT43, the charge/discharge transistor JT33, the unused transistor UT43, the isolated transistor IT33, and the unused transistor UT33 are sequentially connected in series, and the source of the unused transistor UT33 is connected to the source side of the select gate line SGS. In addition, the charge/discharge transistor JT34, the isolated transistor IT44, the unused transistor UT54, the unused transistor UT44, the isolated transistor IT34, and the unused transistor UT34 are sequentially connected in series, and the source of the unused transistor UT34 is connected to the source side of the select gate line SGS. The well potential EL of the well WEL5 is applied to the gates of the isolated transistors IT31 to IT34 and IT41 to IT44. A discharge instruction signal BJ31 is applied to the gate of the charge/discharge transistor JT31. A discharge instruction signal BJ32 is applied to the gate of the charge/discharge transistor JT32. A discharge instruction signal BJ33 is applied to the gate of the charge/discharge transistor JT33. A discharge instruction signal BJ34 is applied to the gate of the charge/discharge transistor JT34.

A gate electrode GH31 of the charge/discharge transistor JT31, a gate electrode GH32 of the charge/discharge transistor JT32, a gate electrode GH33 of the charge/discharge transistor JT33, a gate electrode GH34 of the charge/discharge transistor JT34, a gate electrode GW31 of the isolated transistors IT31 to IT34, and a gate electrode GW32 of the isolated transistors IT41 to IT44 are formed in the active regions AK. The gate electrode GW31 is arranged between the gate electrodes GH31 and GH32. The gate electrode GW32 is arranged between the gate electrodes GH33 and GH34. The gate electrode GH31 is commonly used by the charge/discharge transistor JT31 and the unused transistors UT32 to UT34. The gate electrode GH32 is commonly used by the charge/discharge transistor JT32 and the unused transistors UT31, UT43, and UT44. The gate electrode GH33 is commonly used by the charge/discharge transistor JT33 and the unused transistors UT41, UT42, and UT54. The gate electrode GH34 is commonly used by the charge/discharge transistor JT34 and the unused transistors UT51 to UT53.

The bit line BL1 is connected to the active region AK between the gate electrodes GW31 and GH31 through a contact electrode 54; the bit line BL2 is connected to the active region AK between the gate electrodes GW31 and GH32 through a contact electrode 55; the bit line BL3 is connected to the active region AK between the gate electrodes GW32 and GH33 through a contact electrode 56; and the bit line BL4 is connected to the active region AK between the gate electrodes GW32 and GH34 through a contact electrode 57. The active region AK in the drain side of the gate electrode GH34 is connected to the source line SCE through a contact electrode 53. The active region AK between the gate electrodes GH32 and GH33 is connected to the source line SCE through a contact electrode 52.

When the well potential EL is applied to the gate electrode GW31 of the isolated transistors IT31 to IT34 and the gate electrode GW32 of the isolated transistors IT41 to IT44, the isolated transistors IT31 to IT34 and IT41 to IT44 are turned off. Therefore, the charge/discharge transistor JT31 and the unused transistors UT32, UT33, and UT34, the charge/discharge transistors JT32 and JT33 and the unused transistors UT31, UT41 to UT44, and UT54, and the charge/discharge transistor JT34 and the unused transistors UT51 to UT53 are electrically isolated.

In the configuration illustrated in FIGS. 11A and 11B, selection and non-selection may be alternately switched between the odd-numbered bit lines BL1 and BL3 and the even-numbered bit lines BL2 and BL4, and selection and non-selection may be alternately switched between the two adjacent bit lines BL1 and BL2 and the two adjacent bit lines BL3 and BL4. For example, in the case where the even-numbered bit lines BL2 and BL4 are selected, the potentials of the charge instruction signals BJ32 and BJ34 are set so as to allow the charge/discharge transistors JT32 and JT34 to be cut off, so that the read operation can be normally performed through the even-numbered bit lines BL2 and BL4. At this time, the potentials of the charge instruction signals BJ31 and BJ33 are set so as to allow the charge/discharge transistors JT31 and JT33 to be turned on, so that the charge/discharge operation for the non-selected odd-numbered bit lines BL1 and BL3 can be performed through the sense amplifier circuit 8 and the charge/discharge transistors JT31 and JT33. Therefore, it is possible to increase the speed of the charge/discharge operation.

For example, in the case where two adjacent bit lines BL3 and BL4 are selected, the potentials of the charge instruction signals BJ33 and BJ34 are set so as to allow the charge/discharge transistors JT33 and JT34 to be cut off, so that the write operation can be normally performed through the two adjacent bit lines BL3 and BL4. At this time, the potentials of the charge instruction signals BJ31 and JT32 are set so as to allow the charge/discharge transistors JT31 and JT32 to be turned on, so that the charge/discharge operation for the non-selected bit lines BL1 and BL2 is performed through the sense amplifier circuit 8 and the charge/discharge transistors JT31 and JT32. Therefore, it is possible to increase the speed of the charge/discharge operation.

Seventh Embodiment

Figure 12:
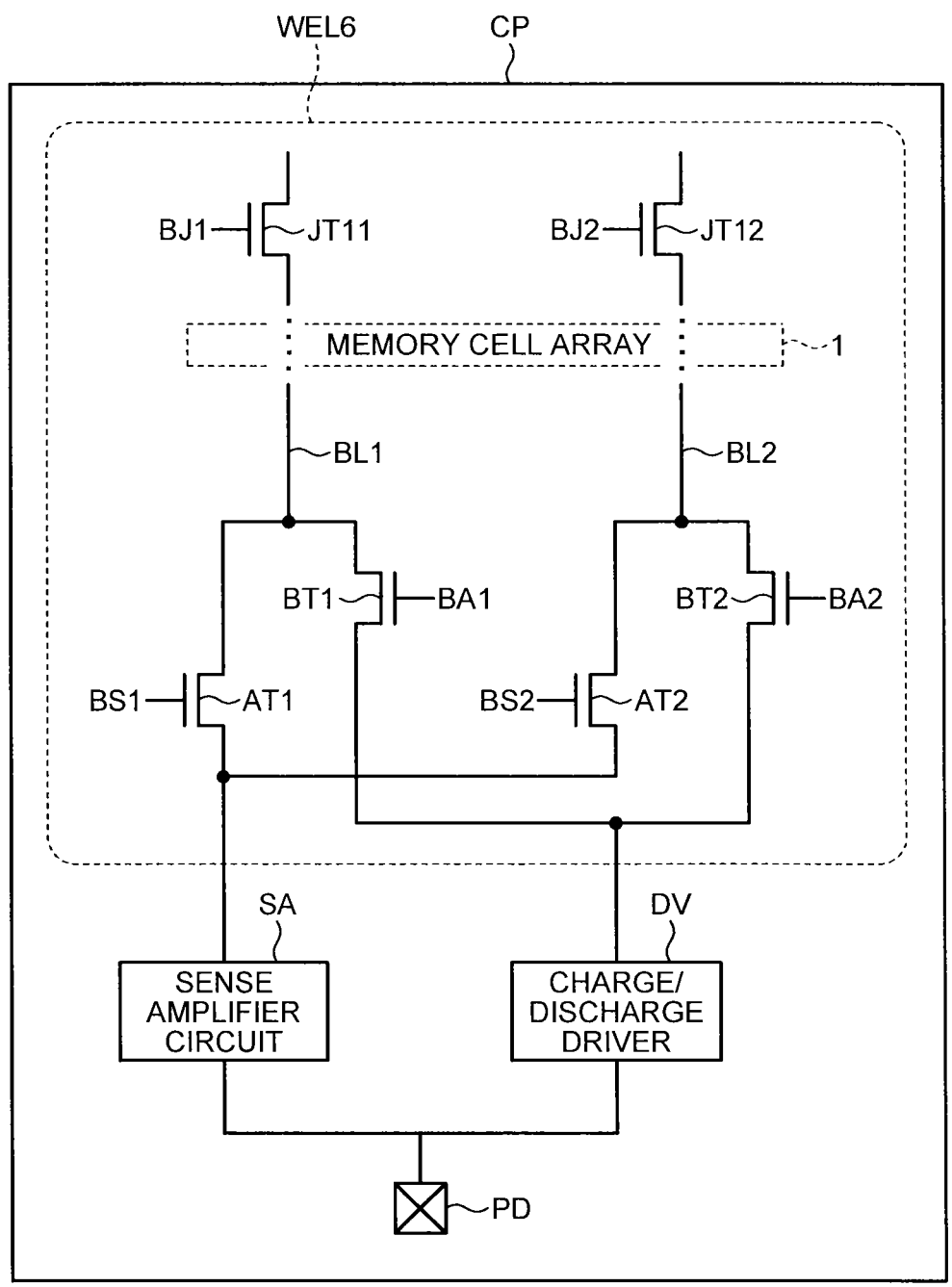
FIG. 12 is a block diagram illustrating an example of a configuration of a charge/discharge circuit applied to a nonvolatile semiconductor storage device according to a seventh embodiment.

FIG. 12 is a block diagram illustrating an example of a configuration of a charge/discharge circuit applied to a non-volatile semiconductor storage device according to a seventh embodiment. FIG. 12 illustrates an example where two bit lines BL1 and BL2 are arranged.

In FIG. 12, a well WEL6, a charge/discharge driver DV, a sense amplifier circuit SA, and a power supply pad PD are formed in a semiconductor chip CP. A memory cell array 1, select transistors AT1 and AT2, switching transistors BT1 and BT2, and charge/discharge transistors JT11 and JT12 are installed in the well WEL6. For example, N-channel field effect transistors may be used as the select transistors AT1 and AT2 and the switching transistors BT1 and BT2.

The sense amplifier circuit SA can determine a value stored in a memory cell based on states of the bit lines BL1 and BL2. The sense amplifier circuit SA may be configured in a voltage sensing manner or in a current sensing manner. The charge/discharge driver DV can perform charging or discharging the bit lines BL1 and BL2. The select transistors AT1 and AT2 can connect the selected bit line to the sense amplifier circuit SA. The switching transistors BT1 and BT2 can connect the non-selected bit line to the charge/discharge driver DV. The power supply pad PD can supply power to the sense amplifier circuit SA and the charge/discharge driver DV.

An end of the bit line BL1 is connected to the sense amplifier circuit SA through a select transistor AT1 and is connected to the charge/discharge driver DV through a switching transistor BT1. The other end of the bit line BL1 is connected to the charge/discharge transistor JT11. An end of the bit line BL2 is connected to the sense amplifier circuit SA through a select transistor AT2 and is connected to the charge/discharge driver DV through a switching transistor BT2. The other end of the bit line BL2 is connected to the charge/discharge transistor JT12. Select signals BS1 and BS2 are applied to the gates of the select transistors AT1 and AT2, respectively; and switching signals BA1 and BA2 are applied to the gates of the switching transistors BT1 and BT2, respectively.

The charge/discharge driver DV can be arranged to be closer to the power supply pad PD than the memory cell array 1. For example, the charge/discharge driver DV may be arranged to be adjacent to the power supply pad PD.

For example, in the case where the even-numbered bit line BL2 is selected, the potential of the charge instruction signal BJ2 is set so as to allow the charge/discharge transistor JT12 to be cut off. In addition, by allowing the select transistor AT2 to be turned on and allowing the switching transistor BT2 to be turned off, the bit line BL2 can be connected to the sense amplifier circuit SA, so that the read operation can be normally performed through even-numbered bit line BL2. At this time, the potential of the charge instruction signal BJ1 is set so as to allow the charge/discharge transistor JT11 to be turned on, and the select transistor AT1 is allowed to be turned off and the switching transistor BT1 is allowed to be turned on, so that the bit line BL1 can be connected to the charge/discharge driver DV and the charge/discharge transistor JT11. Therefore, the charge/discharge operation for the non-selected odd-numbered bit line BL1 can be performed through the charge/discharge driver DV and the charge/discharge transistor JT11, so that it is possible to increase the speed of the charge/discharge operation.

Since the charge/discharge driver DV is arranged to be closer to the power supply pad PD than the memory cell array 1, wire resistance between the power supply pad PD and the discharge driver DV can be reduced, so that it is possible to increase the speed of the charge/discharge operation of the charge/discharge driver DV.

Eighth Embodiment

In the case where electrical conduction test for the charge/discharge transistors JT1 to JTm illustrated in FIG. 4 is performed, the charge/discharge transistors JT1 to JTm are allowed to be turned on in the state where all the memory cells of the memory cell array 1 are non-selected, and the bit lines BL1 to BLm are allowed to be charged through the charge/discharge transistors JT1 to JTm. Next, after the charge/discharge transistors JT1 to JTm are allowed to be turned off, by determining the states of the bit lines BL1 to BLm through the sense amplifier circuit 8, it may be determined whether the charge/discharge transistors JT1 to JTm have a defect.

For example, in the case where the charge/discharge transistor JT1 has an open defect, the bit line BL1 is not charged with electric charges, so that the potential of the bit line BL1 is decreased. Therefore, by determining whether the potential of the bit line BL1 is less than a determinant level, the open defect can be detected in the charge/discharge transistor JT1.

By adjusting parameters of the sense amplifier circuit 8 so as to allow the charge/discharge transistors JT1 to JTm to return a result of acceptance or rejection by using an ON-state current necessary for performing a desired operation as a boundary level, a high-resistance defect can be detected. In the case where a defect is detected in the charge/discharge transistors JT1 to JTm, the defective column may be replaced with a redundancy column in unit of bit lines BL1 to BLm.

In the case where a short-circuit defect is detected in the charge/discharge transistors JT1 to JTm, the charge/discharge transistors JT1 to JTm are allowed to be turned off in the state where all the memory cells of the memory cell array 1 are non-selected. Next, the bit lines BL1 to BLm are allowed to be charged through the sense amplifier circuit 8.

At this time, for example, in the case where the charge/discharge transistor JT1 has a short-circuit defect, since electric charges charged in the bit line BL1 are leaked out through the charge/discharge transistor JT1, the potential of the bit line BL1 is decreased. Therefore, by determining whether the potential of the bit line BL1 is less than a determinant level, the short-circuit defect can be detected in the charge/discharge transistor JT1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a memory cell array in which memory cells are arranged in a row direction and a column direction in a matrix shape;
word lines which select the memory cells in the row direction;
bit lines which select the memory cells in the column direction;
a sense amplifier circuit which determines values stored in the memory cells based on states of the bit lines; and
a charge/discharge circuit which charges or discharges the bit lines in cooperation with a charge operation or a discharge operation for the bit lines by the sense amplifier circuit, wherein there is a time in which a sense amplifier circuit based discharge operation by the sense amplifier circuit and a charge/discharge circuit based discharge operation by the charge/discharge circuit are performed at a same time.

2. The nonvolatile semiconductor storage device according to claim 1, wherein the charge/discharge circuit is formed in a well in which the memory cell array is arranged.

3. The nonvolatile semiconductor storage device according to claim 1, wherein an end of the bit line is connected to the sense amplifier circuit, and the other end of the bit line is connected to the charge/discharge circuit.

4. The nonvolatile semiconductor storage device according to claim 1, wherein the charge/discharge circuit is a charge/discharge transistor.

5. The nonvolatile semiconductor storage device according to claim 4, wherein cell transistors included in the memory cell are connected in series to provide a NAND string, and select transistors are connected to both ends of the NAND string to provide each of NAND cell units.

6. The nonvolatile semiconductor storage device according to claim 5, wherein the charge/discharge transistor is formed in an active region where the cell transistors and the select transistors are formed.

7. The nonvolatile semiconductor storage device according to claim 6, further comprising an isolation transistor which is formed in the active region to electrically isolate the charge/discharge transistor from the select transistor.

8. The nonvolatile semiconductor storage device according to claim 7,
wherein selection and non-selection of an odd-numbered bit line and an even-numbered bit line are configured to be alternately switched,
wherein a charge/discharge transistor corresponding to the odd-numbered bit line and an unused transistor corresponding to the even-numbered bit line share a gate electrode, and
wherein a charge/discharge transistor corresponding to the even-numbered bit line and an unused transistor corresponding to the odd-numbered bit line share a gate electrode.

9. The nonvolatile semiconductor storage device according to claim 7,
wherein selection and non-selection of adjacent first and second bit lines and adjacent third and fourth bit lines are configured to be alternately switched,
wherein charge/discharge transistors corresponding to the first and second bit lines and unused transistors corresponding to the third and fourth bit lines share a gate electrode, and
wherein charge/discharge transistors corresponding to the third and fourth bit lines and unused transistors corresponding to the first and second bit lines share a gate electrode.

10. The nonvolatile semiconductor storage device according to claim 7,
wherein selection and non-selection of an odd-numbered bit line and an even-numbered bit line are configured to be alternately switched, and selection and non-selection of adjacent first and second bit lines and adjacent third and fourth bit lines are configured to be alternately switched,
wherein a charge/discharge transistor corresponding to the first bit line and unused transistors corresponding to the second, third, and fourth bit lines share a gate electrode,
wherein a charge/discharge transistor corresponding to the second bit line and unused transistors corresponding to the first, third, and fourth bit lines share a gate electrode,
wherein a charge/discharge transistor corresponding to the third bit line and unused transistors corresponding to the first, second, and fourth bit lines share a gate electrode, and
wherein a charge/discharge transistor corresponding to the fourth bit line and unused transistors corresponding to the first, second, and third bit lines share a gate electrode.

11. The nonvolatile semiconductor storage device according to claim 1, wherein the bit line is allowed to be charged through the charge/discharge circuit in a state where all the memory cells of the memory cell array are non-selected, and, by determining a potential of the bit line through the sense amplifier circuit, it is determined whether the charge/discharge circuit has a defect.

12. A nonvolatile semiconductor storage device comprising:
a memory cell array in which memory cells are arranged in a row direction and a column direction in a matrix shape;
word lines which select the memory cells in the row direction;
bit lines which select the memory cells in the column direction;
a sense amplifier circuit which determines values stored in the memory cells based on states of the bit lines; and
a charge/discharge circuit which is formed in a well where the memory cell array is arranged and which charges or discharges the bit lines, wherein there is a time in which a sense amplifier circuit based discharge operation by the sense amplifier circuit and a charge/discharge circuit based discharge operation by the charge/discharge circuit are performed at a same time.

13. The nonvolatile semiconductor storage device according to claim 12, wherein the charge/discharge circuit is a charge/discharge transistor.

14. The nonvolatile semiconductor storage device according to claim 13, wherein cell transistors included in the memory cell array are connected in series to provide a NAND string, and select transistors are connected to both ends of the NAND string to provide each of NAND cell units.

15. The nonvolatile semiconductor storage device according to claim 14, wherein the charge/discharge transistor is formed in an active region where the cell transistors and the select transistors are formed.

16. The nonvolatile semiconductor storage device according to claim 15, further comprising an isolation transistor which is formed in the active region to electrically isolate the charge/discharge transistor and the select transistor.

17. The nonvolatile semiconductor storage device according to claim 16,
wherein selection and non-selection of an odd-numbered bit line and an even-numbered bit line are configured to be alternately switched,
wherein a charge/discharge transistor corresponding to the odd-numbered bit line and an unused transistor corresponding to the even-numbered bit line share a gate electrode, and
wherein a charge/discharge transistor corresponding to the even-numbered bit line and an unused transistor corresponding to the odd-numbered bit line share a gate electrode.

18. The nonvolatile semiconductor storage device according to claim 16,
wherein selection and non-selection of adjacent first and second bit lines and adjacent third and fourth bit lines are configured to be alternately switched,
wherein charge/discharge transistors corresponding to the first and second bit lines and unused transistors corresponding to the third and fourth bit lines share a gate electrode, and wherein charge/discharge transistors corresponding to the third and fourth bit lines and unused transistors corresponding to the first and second bit lines share a gate electrode.

19. The nonvolatile semiconductor storage device according to claim 16,
wherein selection and non-selection of an odd-numbered bit line and an even-numbered bit line are configured to be alternately switched, selection and non-selection of adjacent first and second bit lines and adjacent third and fourth bit lines are configured to be alternately switched,
wherein a charge/discharge transistor corresponding to the first bit line and unused transistors corresponding to the second, third, and fourth bit lines share a gate electrode,
wherein a charge/discharge transistor corresponding to the second bit line and unused transistors corresponding to the first, third, and fourth bit lines share a gate electrode,
wherein a charge/discharge transistor corresponding to the third bit line and unused transistors corresponding to the first, second, and fourth bit lines share a gate electrode, and
wherein a charge/discharge transistor corresponding to the fourth bit line and unused transistors corresponding to the first, second, and third bit lines share a gate electrode.

20. A nonvolatile semiconductor storage device comprising:
a memory cell array in which memory cells are arranged in a row direction and a column direction in a matrix shape;
word lines which select the memory cells in the row direction;
bit lines which select the memory cells in the column direction;
a sense amplifier circuit which determines values stored in the memory cells based on states of the bit lines; and
a charge/discharge driver which charges or discharges the bit lines;
a select transistor which connects a selected bit line to the sense amplifier circuit;
a switching transistor which connects a non-selected bit line to the charge/discharge driver; and
a power supply pad which supplies power to the sense amplifier circuit and the charge/discharge driver,
wherein the charge/discharge driver is arranged to be closer to the power supply pad than the memory cell array,
wherein there is a time in which a sense amplifier circuit based discharge operation by the sense amplifier circuit and a charge/discharge circuit based discharge operation by the charge/discharge driver are performed at a same time.

* * * * *